United States Patent
Tsai et al.

(10) Patent No.: US 9,768,414 B2
(45) Date of Patent: Sep. 19, 2017

(54) DISPLAY DEVICE

(71) Applicant: Innolux Corporation, Miao-Li County (TW)

(72) Inventors: Chi-Che Tsai, Miao-Li County (TW); Po-Ching Lin, Miao-Li County (TW); Wei-Yen Wu, Miao-Li County (TW); Hui-Chen Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/079,263

(22) Filed: Mar. 24, 2016

(65) Prior Publication Data

US 2016/0204380 A1 Jul. 14, 2016

Related U.S. Application Data

(63) Continuation-in-part of application No. 14/940,301, filed on Nov. 13, 2015, now abandoned, which is a
(Continued)

(30) Foreign Application Priority Data

Feb. 18, 2013 (TW) .............................. 102105491 A

(51) Int. Cl.
  *H01L 51/52* (2006.01)
  *H01L 27/32* (2006.01)

(52) U.S. Cl.
  CPC ...... *H01L 51/5253* (2013.01); *H01L 27/3244* (2013.01); *H01L 51/5243* (2013.01); *H01L 51/5246* (2013.01); *H01L 2251/301* (2013.01)

(58) Field of Classification Search
  CPC .......................... H01L 51/5243; H01L 51/5246
  See application file for complete search history.

(56) References Cited

U.S. PATENT DOCUMENTS 7,160,784 B2   1/2007 Yamazaki et al.
2002/0038851 A1*  4/2002 Kajiwara ............. A61B 6/4216
                                                     250/368
(Continued)

FOREIGN PATENT DOCUMENTS

CN       1248295 C      3/2006
CN     101653040 A      2/2010
(Continued)

OTHER PUBLICATIONS

Final Office Action issued in U.S. Appl. No. 14/940,301, filed Nov. 13, 2015, mailed Sep. 12, 2016.
(Continued)

*Primary Examiner* — Eliseo Ramos Feliciano
*Assistant Examiner* — Mikka Liu
(74) *Attorney, Agent, or Firm* — McClure, Qualey & Rodack, LLP

(57) ABSTRACT

A display device is provided. The display device includes a first substrate, a first barrier layer disposed on the first substrate, a second substrate, a second barrier layer disposed on the second substrate, an display medium disposed between the first barrier layer and the second barrier layer, and a metal enclosing wall connecting the first substrate to the second substrate and surrounding the display medium. The metal enclosing wall includes a first metal layer having a first opening and connected to the first substrate, a second metal layer connected to the second substrate, and a third metal layer formed between the first metal layer and the second metal layer.

9 Claims, 6 Drawing Sheets

FIG. 5

Related U.S. Application Data continuation of application No. 14/165,617, filed on Jan. 28, 2014, now Pat. No. 9,246,128.

(56) References Cited

U.S. PATENT DOCUMENTS

| | | |
|---|---|---|
| 2002/0125484 A1 | 9/2002 | Silvernail et al. |
| 2003/0062533 A1 | 4/2003 | Yee et al. |
| 2004/0170927 A1 | 9/2004 | Pichler |
| 2004/0238827 A1* | 12/2004 | Takayama ............ H01L 27/1214 257/79 |
| 2007/0172971 A1* | 7/2007 | Boroson ............. H01L 51/5246 438/26 |
| 2007/0200492 A1 | 8/2007 | Cok et al. |
| 2009/0026934 A1* | 1/2009 | Fujita ....................... C09J 7/021 313/504 |
| 2009/0130941 A1 | 5/2009 | Boroson et al. |
| 2010/0109516 A1* | 5/2010 | Warashina .......... H01L 51/5246 313/504 |
| 2010/0304171 A1 | 12/2010 | Tomantschger et al. |
| 2010/0328282 A1 | 12/2010 | Su et al. |
| 2011/0234509 A1 | 9/2011 | Lee et al. |
| 2011/0279023 A1 | 11/2011 | Nishioka et al. |
| 2012/0162967 A1 | 6/2012 | Ida |

FOREIGN PATENT DOCUMENTS

| | | |
|---|---|---|
| TW | 533463 | 5/2003 |
| TW | 200848887 A | 12/2008 |
| TW | 201037829 A | 10/2010 |

OTHER PUBLICATIONS

TW Office Action dated Apr. 17, 2015 in corresponding Taiwan application (No. 102105491).
SIPO Office Action dated Mar. 4, 2016 in corresponding CN application (No. 201310052848.4).
Non-Final Office Action issued in U.S. Appl. No. 14/940,301, filed Nov. 13, 2015, mailed Mar. 28, 2016.

* cited by examiner

DISPLAY DEVICE

This is a continuation-in-part application of application Ser. No. 14/940,301, filed Nov. 13, 2015, which is a continuation application of U.S. application Ser. No. 14/165,617, filed Jan. 28, 2014 (now issued as U.S. Pat. No. 9,246,128), which claims the benefit of Taiwan application Serial No. 102105491, filed Feb. 18, 2013, the subject matter of which is incorporated herein by reference.

BACKGROUND

Technical Field

The disclosure relates in general to a display device, and particularly to a display device with superior water-oxygen resistant abilities.

Description of the Related Art

Along with the progress of display technology, various types of display devices have been developed, among which organic light emitting diode display devices have become one of the most important research targets of display technology. Therefore, the development and design of arranging organic light emitting diodes in flexible display devices have advanced rapidly as well.

However, organic light emitting diodes are vulnerable to the oxidation by water (moisture) and oxygen, and thus the operating functions thereof are influenced. On the other hand, despite having superior water-oxygen resistant abilities, frits are rarely adopted as barrier structures due to the difficulties of frits conforming to the requirements of flexibility of display devices. In view of that, the research and development of the resistance to water and oxygen for flexible organic light emitting diode display devices have become a huge challenge. Therefore, researchers have been working on providing flexible organic light emitting diode display devices with superior water-oxygen resistant abilities.

SUMMARY

The disclosure relates to a display device. In the display device, a metal enclosing wall connects two substrates and surrounds the display medium to form a lateral barrier structure to prevent water and oxygen penetration, together with the barrier layers disposed above and below the display medium, respectively, the water-oxygen resistant abilities of the display device can be significantly increased.

According to an aspect of the present disclosure, a display device is provided. The display device includes a second substrate, a first barrier layer disposed on the second substrate, a first substrate, a second barrier layer disposed on the first substrate, a display medium disposed between the first barrier layer and the second barrier layer, and a metal enclosing wall connecting the first substrate to the second substrate and surrounding the display medium. The metal enclosing wall includes a first metal layer having a first opening and connected to the first substrate, a second metal layer connected to the second substrate, and a third metal layer formed between the first metal layer and the second metal layer.

According to another aspect of the present disclosure, a display device is provided. The display device includes a second substrate, a first barrier layer disposed on the second substrate, a first substrate, a second barrier layer disposed on the first substrate, a display medium disposed between the first barrier layer and the second barrier layer, and a metal enclosing wall connecting the first substrate to the second substrate and surrounding the display medium. The metal enclosing wall includes a first metal layer connected to the first substrate, a second metal layer connected to the second substrate, a third metal layer disposed between the first metal layer and the second metal layer, and a first cocrystallization layer formed between the first metal layer and the third metal layer.

The above and other aspects of the disclosure will become better understood with regard to the following detailed description of the non-limiting embodiment(s). The following description is made with reference to the accompanying drawings.

DETAILED DESCRIPTION

In the embodiments of the present disclosure, a display device is provided. In the display device, a metal enclosing wall connects two substrates and surrounds the display medium to form a lateral barrier structure to prevent water and oxygen penetration, together with the barrier layers disposed above and below the display medium, respectively, the water-oxygen resistant abilities of the display device can be significantly increased. The following embodiments are for the purpose of elaboration only, not for limiting the scope of protection of the disclosure. Detailed structures and processes may be modified or changed by one skilled in the art after having the benefit of this description of the disclosure.

Figure 1A:
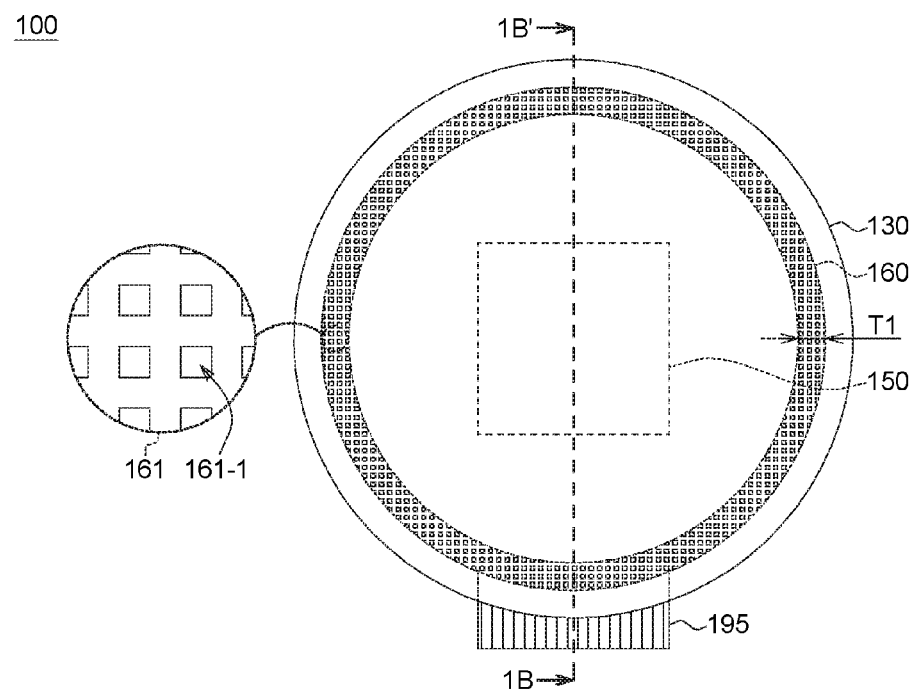
FIG. 1A shows a top view of a display device according to an embodiment of the present disclosure.
Figure 1B:
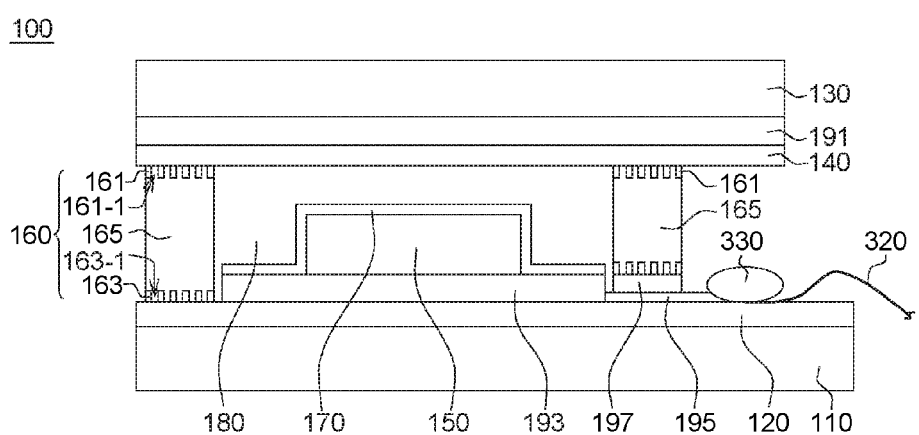
FIG. 1B shows a cross-sectional view along the section line 1B-1B' in FIG. 1A.

Referring to FIGS. 1A-1B, FIG. 1A shows a top view of a display device 100 according to an embodiment of the present disclosure, and FIG. 1B shows a cross-sectional view along the section line 1B-1B' in FIG. 1A. As shown in FIGS. 1A-1B, the display device 100 includes a second substrate 110, a first barrier layer 120, a first substrate 130, a second barrier layer 140, a display medium 150, and a metal enclosing wall 160. The first barrier layer 120 is disposed on the second substrate 110, and the second barrier layer 140 is disposed on the first substrate 130. The display medium 150 is disposed between the first barrier layer 120 and the second barrier layer 140. The metal enclosing wall 160 connects the second substrate 110 to the first substrate 130 and surrounds the display medium 150, such that the display medium 150 can be sealed between the second substrate 110 and the first substrate 130.

In the embodiments of the present disclosure, the display medium 150 may be an organic light emitting diode element or a liquid crystal layer, and the display device 100 may be an OLED display device or a LCD display device accordingly. However, the selections of the type of the display medium 150 of the present disclosure may vary according to actual needs and are not limited thereto.

As shown in FIGS. 1A-1B, the metal enclosing wall 160 includes a first metal layer 161, a second metal layer 163, and a third metal layer 165. The first metal layer 161 is connected to the first substrate 130, and the first metal layer 161 has a first opening 161-1. The second metal layer 163 is connected to the second substrate 110. The third metal layer 165 is formed between the first metal layer 161 and the second metal layer 163.

As shown in FIGS. 1A-1B, the first substrate 130 is assembled to the second substrate 110, and the metal enclosing wall 160 surrounds the display medium 150 to form a lateral barrier structure to prevent water and oxygen penetration. With the metal enclosing wall 160 together with the first barrier layer 120 below the display medium 150 and the second barrier layer 140 above the display medium 150, the display device is provided with an excellent water-oxygen resistant ability with a water vapor transmission rate (WVTR) of 10-6. In the embodiment, as shown in FIG. 1A, the metal enclosing wall 160 has a thickness T1 of about 540-660 μm, for example, the thickness T1 may be about 600 μm.

In the embodiment, the second substrate 110 and the first substrate 130 may be flexible transparent substrates with thicknesses of about 10-15 μm, and the materials thereof include such as polyimide (PI). In an embodiment, the first substrate 130 may be a touch panel. In the embodiment, the first barrier layer 120 and the second barrier layer 140 are independently silicon nitride (SiN) or stacked layers of silicon nitride and silicon oxide (SiNx/SiOx), and both have water-oxygen resistant abilities.

As shown in FIG. 1B, the display device 100 may further include a third barrier layer 170, and the third barrier layer 170 is formed on and covering the display medium 150. The third barrier layer 170 is provided with water-oxygen resistant abilities, which is advantageous to preventing the display medium 150 from being oxidized by water and oxygen. The third barrier layer 170 is such as a silicon nitride layer or stacked layers of silicon nitride and silicon oxide.

As shown in FIG. 1B, the display device 100 may further include a filling material 180. The filling material 180 is filled inside the metal enclosing wall 160 and covers the display medium 150. In the embodiments, the filling material 180 has hydrophilic functional groups adjacent to the first barrier layer 120 and the second barrier layer 140, and the filling material 180 has hydrophobic functional groups adjacent to the display medium 150. As such, the hydrophilic functional groups allow the filling material 180 to have a better adhesion to the barrier layers 120/140, and the hydrophobic functional groups provide better water-oxygen resistant abilities for the display medium 150.

In the embodiment, as shown in FIGS. 1A-1B, the first metal layer 161 may have a plurality of the first openings 161-1. When a laser is applied from the first substrate side to thermally cure the metal enclosing wall 160 in the manufacturing process, the openings 161-1 allow the laser beam to reach the material of the third metal layer 165 below the first metal layer 161.

In the embodiment, as shown in FIG. 1B, the second metal layer 163 has at least a second opening 163-1. In the embodiment, as shown in FIG. 1B, the second metal layer 163 may have a plurality of the second openings 163-1.

In the embodiment, as shown in FIGS. 1A-1B, the display device 100 may further include a color filter 191 and/or a thin film transistor layer 193 and a fan-out structure 195. The thin film transistor layer 193 is disposed between the second substrate 110 and the display medium 150. The fan-out structure 195 is disposed between the second substrate 110 and the second metal layer 163. The fan-out structure 195 is electrically isolated from the second metal layer 163 by an insulator 197. In one embodiment, as shown in FIG. 1B, the display medium 150 is such as a white light organic light emitting diode, and the color filter 191 is disposed between the first substrate 130 and the organic light emitting diode 150. In an alternative embodiment, the display medium 150 is such as a RGB organic light emitting diode, and in such case, a color filter is not required to be disposed between the first substrate 130 and the display medium 150.

In the embodiments, a material of the first metal layer 161 and a material of the second metal layer 163 may respectively include copper (Cu). In the embodiment, the thickness of the first metal layer 161 and the thickness of the second metal layer 163 are such as 300-1000 nm.

In the embodiments, a material of the third metal layer 165 may include a metal satisfying the following condition: $1<R_{PB}<2$, wherein $R_{PB}=(M_{oxide}*\rho_{metal})/(n*M_{metal}*\rho_{oxide})$, $M_{metal}$ is the atomic mass of the metal, $M_{oxide}$ is the molecular mass of a metal oxide of the metal, $\rho_{metal}$ is the density of the metal, $\rho_{oxide}$ is the density of the metal oxide of the metal, and n is the number of atoms per molecule of the metal oxide of the metal.

The above equation can be rewritten as: $R_{PB}=(V_{oxide}/(V_{metal})$, $V_{metal}$ is the molar volume of the metal, and $V_{oxide}$ is the molar volume of the metal oxide of the metal.

In the embodiments, when the metal material of the third metal layer 165 of the metal enclosing wall 160 is oxidized by water/oxygen, since the oxidation starts from the surface of the metal layer, a metal oxide coating is formed on the surface of the metal layer. When $R_{PB}<1$, the metal oxide coating would be too thin, such that the metal oxide coating is likely to break or crack and thus provides no protective or barrier effects. On the other hand, when $R_{PB}>2$, the structure of the metal oxide coating would be too loose and may chip off and provide no protective or barrier effects either. According to the embodiments of the present disclosure, the metal used for making the third metal layer 165 satisfies the condition of $1<R_{PB}<2$; accordingly, when the third metal layer 165 is oxidized from an outer surface, the metal oxide coating formed on the outer surface is thick and compact and thus can provide excellent protective and barrier effects.

Table 1 shows the selections of metals satisfying the above condition, and the metals listed in Table 1 can be used as the material of the third metal layer 165.

TABLE 1

| Metal | Metal oxide | $R_{PB}$ |
|---|---|---|
| Cr | $Cr_2O_3$ | 1.99 |
| Co | $Co_3O_4$ | 1.99 |
| Ti | $TiO_2$ | 1.95 |
| Mn | MnO | 1.79 |

TABLE 1-continued

| Metal | Metal oxide | $R_{PB}$ |
|---|---|---|
| Fe | FeO | 1.77 |
| Cu | $Cu_2O$ | 1.68 |
| Zn | ZnO | 1.62 |
| Pd | PdO | 1.60 |
| Be | BeO | 1.59 |
| Ag | $Ag_2O$ | 1.59 |
| Ni | NiO | 1.52 |
| Zr | $ZrO_2$ | 1.51 |
| Pb | $PbO_2$ | 1.40 |
| Sn | $SnO_2$ | 1.32 |
| Th | $ThO_2$ | 1.32 |
| Hg | HgO | 1.31 |
| Al | $Al_2O_3$ | 1.28 |
| Cd | CdO | 1.21 |
| Ce | $Ce_2O_3$ | 1.16 |

As shown in FIG. 1B, the display device 100 may further include a flexible cable 320 and a solder pad 330. In the embodiment as shown in FIG. 1B, the flexible cable 320 is bonded to the fan-out structure 195 through the solder pad 330.

Figure 2:
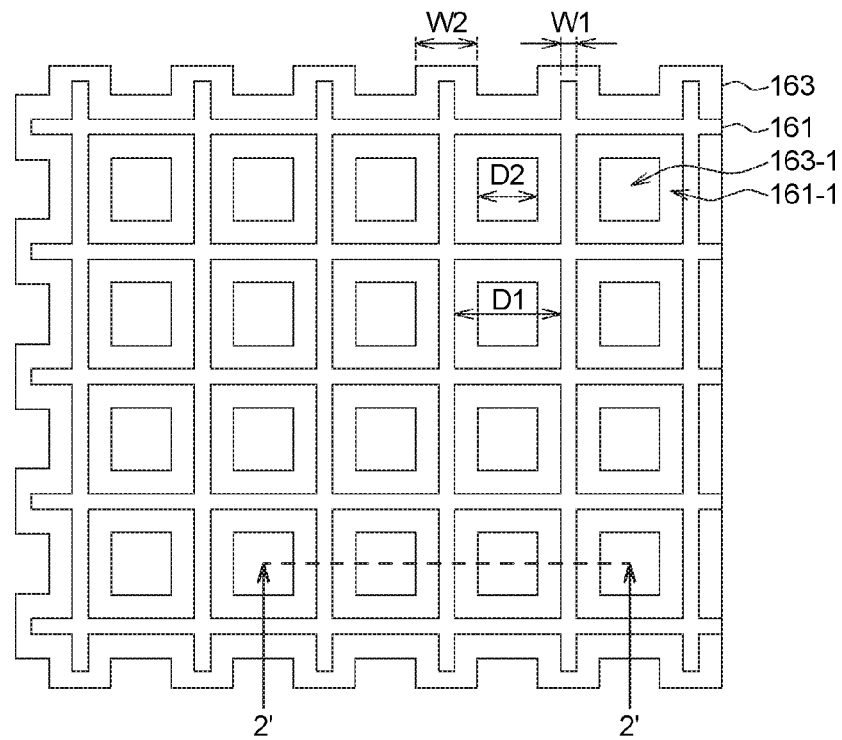
FIG. 2 shows a partial top view of a first metal layer and a second metal layer according to an embodiment of the present disclosure.
Figure 3A:
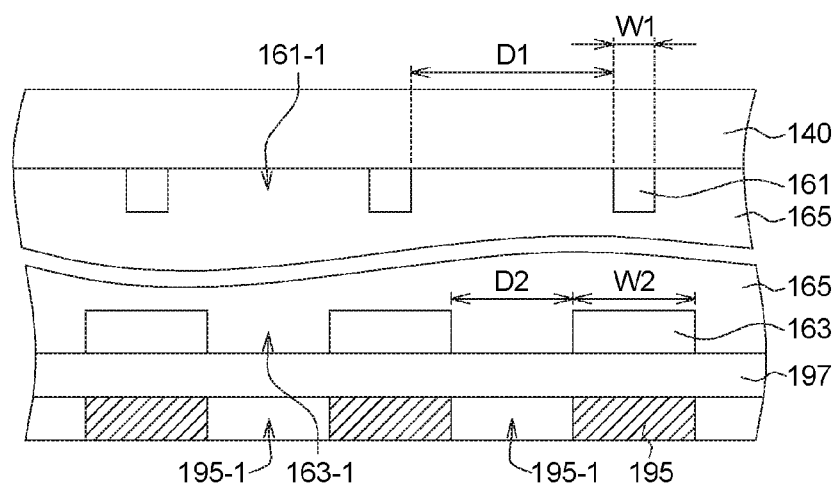
FIG. 3A shows a cross-sectional view along the section line 2-2' in FIG. 2.

FIG. 2 shows a partial top view of a first metal layer and a second metal layer according to an embodiment of the present disclosure, and FIG. 3A shows a cross-sectional view along the section line 2-2' in FIG. 2. The elements in the present embodiment sharing the same labels with those in the previous embodiments are the same elements, and the description of which is omitted.

As shown in FIG. 2 and FIG. 3A, the width W1 of the cross-section of a portion of the first metal layer 161 is smaller than the width W2 of the cross-section of a portion of the second metal layer 163. The diameter D1 of the first opening 161-1 is larger than the diameter D2 of the second opening 163-1. In the present embodiment, the width W1 is such as about 10±1 μm, the diameter D1 of the first opening 161-1 is such as about 50±5 μm, the width W2 is such as about 30±3 μm, and the diameter D2 of the second opening 163-1 is such as about 30±3 μm.

In the embodiments, as shown in FIG. 2, the portions having the width W1 of the first metal layer 161 are ribs forming a grid pattern with the first openings 161-1, and the portions having the width W2 of the second metal layer 163 are ribs forming a grid pattern with the second openings 163-1. In the present embodiment as shown in FIG. 3A, the light transmission of a unit area of the first metal layer 161 is about 66%.

In addition, in the embodiment, as shown in FIG. 3A, the fan-out structure 195 has a plurality of openings 195-1 located below and corresponding to the second openings 163-1 of the second metal layer 163. In the present embodiment, the fan-out structure 195 may have a pattern substantially the same with the pattern of the second metal layer 163; for example, the fan-out structure 195 has a grid pattern with the openings 195-1. In other words, the fan-out structure 195 is not exposed by the second openings 163-1 of the second metal layer 163. As such, when a laser is applied from the first substrate side to thermally cure the metal enclosing wall 160, the matching openings 163-1 and openings 195-1 allow the laser beam to heat the third metal layer 165 without being reflected by any exposed metal layer (e.g. the fan-out structure 195), such that the heating efficiency of the laser beam can be well controlled.

Figure 3B:
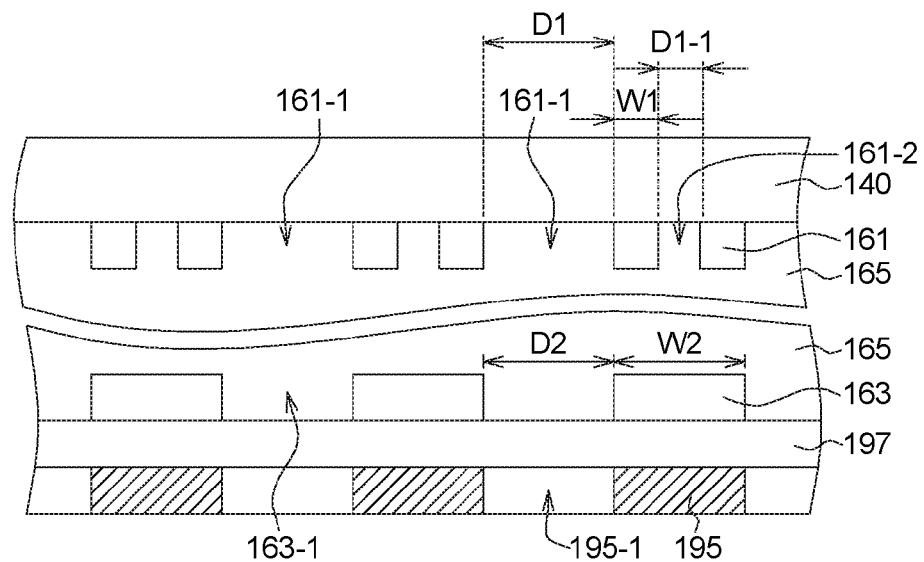
FIGS. 3B-3D show cross-sectional views according some embodiments of the present disclosure.
Figure 3C:
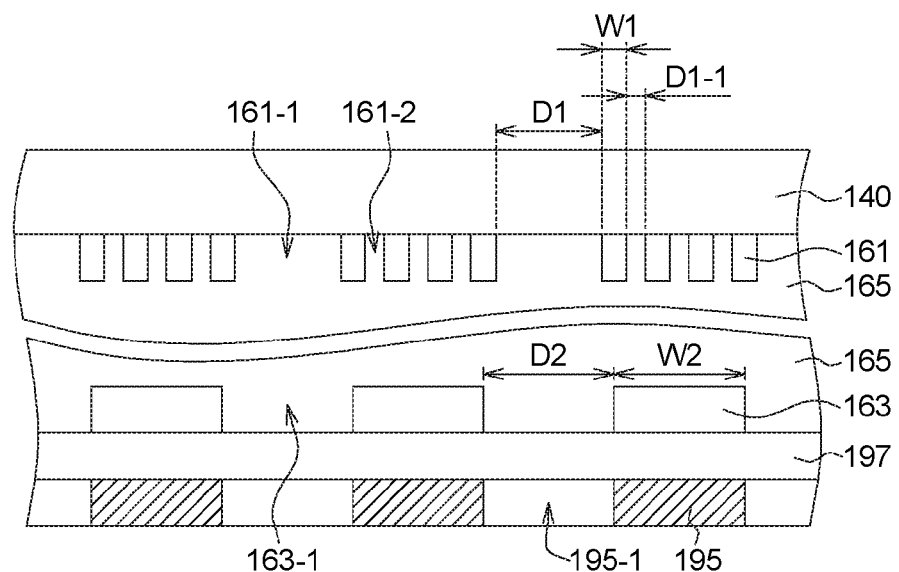
Figure 3D:
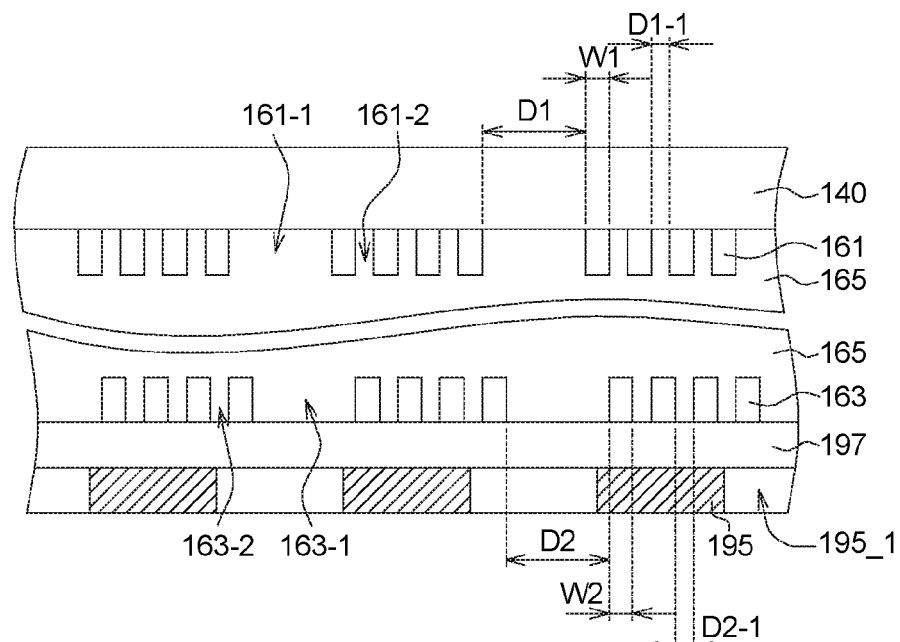

FIGS. 3B-3D show cross-sectional views according some embodiments of the present disclosure, showing modifications of the first metal layer and the second metal layer according to the structure of FIG. 3A. The elements in the present embodiment sharing the same labels with those in the previous embodiments are the same elements, and the description of which is omitted.

In the present embodiment, the structure as shown in FIG. 3B has a grid pattern similar to that of the structure as shown in FIG. 3A. As shown in FIG. 3B, the width W1 of the cross-section of a portion of the first metal layer 161 is smaller than the width W2 of the cross-section of a portion of the second metal layer 163. In the present embodiment, the portions having the width W1 of the first metal layer 161 are ribs forming a grid pattern with two types of first openings 161-1 and 161-2, and the portions having the width W2 of the second metal layer 163 are ribs forming a grid pattern with the second openings 163-1. In the present embodiment as shown in FIG. 3B, the light transmission of a unit area of the first metal layer 161 is about 33%.

In the embodiment, the diameter D1 of the first opening 161-1 is substantially equal to the diameter D2 of the second opening 163-1, and the diameter D1-1 of the first opening 161-2 is smaller than the diameter D2 of the second opening 163-1. In the present embodiment, the width W1 is such as about 10±1 μm, the diameter D1 of the first opening 161-1 is such as about 30±3 μm, the diameter D1-1 of the first opening 161-2 is such as about 10±1 μm, the width W2 is such as about 30±3 μm, and the diameter D2 of the second opening 163-1 is such as about 30±3 μm.

In the present embodiment, the structure as shown in FIG. 3C has a grid pattern similar to that of the structure as shown in FIG. 3A. As shown in FIG. 3C, the width W1 of the cross-section of a portion of the first metal layer 161 is smaller than the width W2 of the cross-section of a portion of the second metal layer 163. In the present embodiment, the portions having the width W1 of the first metal layer 161 are ribs forming a grid pattern with two types of first openings 161-1 and 161-2, and the portions having the width W2 of the second metal layer 163 are ribs forming a grid pattern with the second openings 163-1. In the present embodiment as shown in FIG. 3C, the light transmission of a unit area of the first metal layer 161 is about 50%.

In the embodiment, the diameter D1 of the first opening 161-1 is substantially equal to the diameter D2 of the second opening 163-1, and the diameter D1-1 of the first opening 161-2 is smaller than the diameter D2 of the second opening 163-1. In the present embodiment, the width W1 is such as about 5±1 μm, the diameter D1 of the first opening 161-1 is such as about 30±3 μm, the diameter D1-1 of the first opening 161-2 is such as about 5±1 μm, the width W2 is such as about 30±3 μm, and the diameter D2 of the second opening 163-1 is such as about 30±3 μm.

In the present embodiment, the structure as shown in FIG. 3D has a grid pattern similar to that of the structure as shown in FIG. 3A. As shown in FIG. 3D, the width W1 of the cross-section of a portion of the first metal layer 161 is substantially equal to the width W2 of the cross-section of a portion of the second metal layer 163. In the present embodiment, the portions having the width W1 of the first metal layer 161 are ribs forming a grid pattern with two types of first openings 161-1 and 161-2, and the portions having the width W2 of the second metal layer 163 are ribs forming a grid pattern with two types of second openings 163-1 and 163-2. In the present embodiment as shown in FIG. 3D, the light transmission of a unit area of the first metal layer 161 is about 50%.

In the embodiment, the diameter D1 of the first opening 161-1 is substantially equal to the diameter D2 of the second opening 163-1, and the diameter D1-1 of the first opening 161-2 is substantially equal to the diameter D2 of the second opening 163-1. In the present embodiment, the width W1 is such as about 5±1 μm, the diameter D1 of the first opening 161-1 is such as about 30±3 μm, the diameter D1-1 of the first opening 161-2 is such as about 5±1 μm, the width W2 is such as about 5±1 μm, the diameter D2 of the second opening 163-1 is such as about 30±3 μm, and the diameter D2-1 of the second opening 163-2 is such as about 5±1 μm.

Figure 4A:
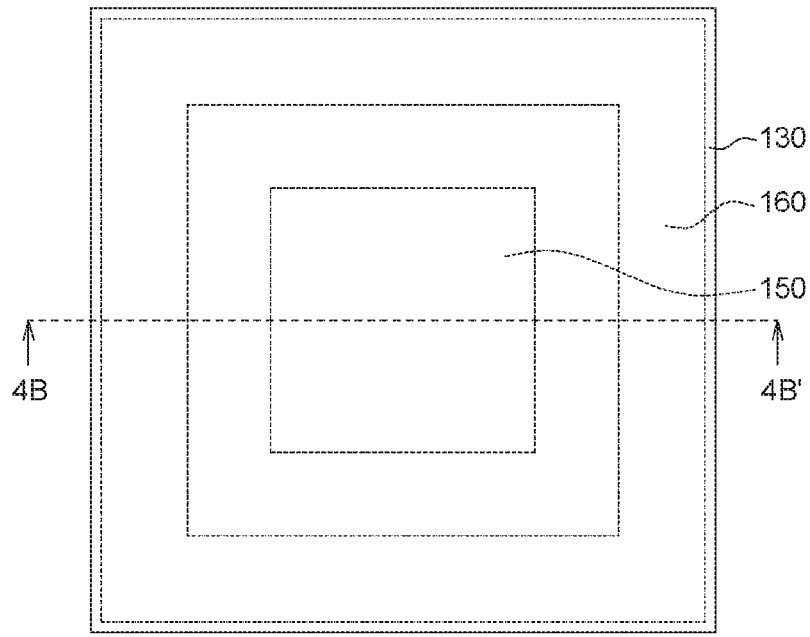
FIG. 4A shows a top view of a display device according to another embodiment of the present disclosure.
Figure 4B:
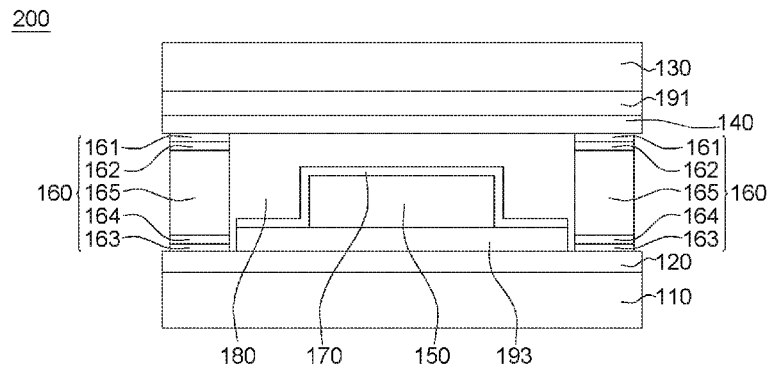
FIG. 4B shows a cross-sectional view along the section line 4B-4B' in FIG. 4A.

Referring to FIGS. 4A-4B, FIG. 4A shows a top view of a display device 200 according to another embodiment of the present disclosure, and FIG. 4B shows a cross-sectional view along the section line 4B-4B' in FIG. 4A. The elements in the present embodiment sharing the same labels with those in the previous embodiments are the same elements, and the description of which is omitted.

As shown in FIGS. 4A-4B, in the display device 200, the metal enclosing wall 160 may further include a first cocrystallization layer 162 formed between the first metal layer 161 and the third metal layer 165. The first cocrystallization layer 162 is formed by the cocrystallization of the materials of the first metal layer 161 and the third metal layer 165 when connecting the first metal layer 161 and the third metal layer 165.

In the embodiments of the present disclosure, the first cocrystallization layer 162 may have a singled-layered structure or a multi-layered structure.

As shown in FIG. 4B, the metal enclosing wall 160 may further include a second cocrystallization layer 164 formed between the second metal layer 163 and the third metal layer 165. The second cocrystallization layer 164 is formed by the cocrystallization of the materials of the second metal layer 163 and the third metal layer 165 when connecting the second metal layer 163 and the third metal layer 165.

In the embodiments of the present disclosure, the second cocrystallization layer 164 may have a singled-layered structure or a multi-layered structure.

In an embodiment, the first metal layer 161 and the second metal layer 163 include cooper, the third metal layer 165 includes tin (Sn), tin-silver (Sn—Ag) alloy, or tin-silver-bismuth (Sn—Ag—Bi) alloy, and thus the first cocrystallization layer 162 and the second cocrystallization layer 164 are Cu—Sn alloy layers. In the present embodiment, the first cocrystallization layer 162 and the second cocrystallization layer 164 include such as $Cu_6Sn_5$, which has a more compact structure than that of $Cu_3Sn$.

In the embodiments, each of the first cocrystallization layer 162 and the second cocrystallization layer 164 has a cocrystallization temperature of equal to or less than 230° C., for example, 80-230° C. Since the cocrystallization temperature is relatively low, the heat generated during the laser curing process does not damage the display medium 150.

In the embodiments, each of the first cocrystallization layer 162 and the second cocrystallization layer 164 may have a thickness of equal to or less than 5 Å, for example, 2-5 Å. When the thickness is larger than 5 Å, the strength of the layers 162/164 would turn weak and may crack easily. According to the embodiments of the present disclosure, the first cocrystallization layer 162 and/or the second cocrystallization layer 164 having the thickness of equal to or less than 5 Å can be provided with good uniformity as well as excellent strength.

Figure 5:
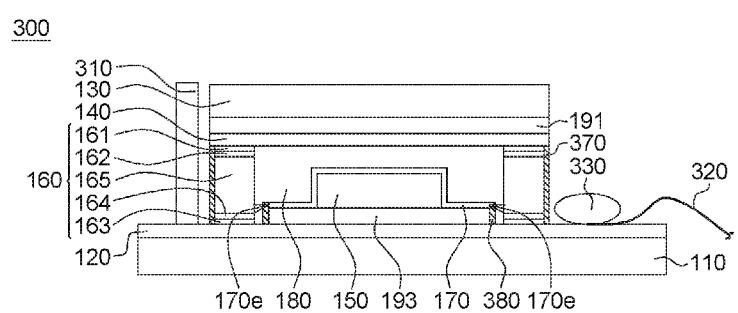
FIG. 5 shows a schematic view of a display device according to an additional embodiment of the present disclosure.

FIG. 5 shows a schematic view of a display device 300 according to an additional embodiment of the present disclosure. The elements in the present embodiment sharing the same labels with those in the previous embodiments are the same elements, and the description of which is omitted.

As shown in FIG. 5, in the embodiment, the display device 300 may further include an inorganic barrier layer 370, and the inorganic barrier layer 370 covers a sidewall of the metal enclosing wall 160. More specifically, as shown in FIG. 5, the inorganic barrier layer 370 covers the outer sidewall of the metal enclosing wall 160 for preventing water and oxygen from penetrating through the metal enclosing wall 160 and damaging the display medium 150.

In the embodiment, as shown in FIG. 5, the inorganic barrier layer 370 covers the sidewall of the metal enclosing wall 160 where the first metal layer 161 is connected to the third metal layer 165 and where the second metal layer 163 is connected to the third metal layer 165. While the connecting interfaces are more vulnerable to water and oxygen penetration, the inorganic barrier layer 370 covering the connecting interfaces between the metal layers is advantageous to preventing the display medium 150 from being oxidized by water and oxygen.

In the embodiment, as shown in FIG. 5, the display device 300 may further include an inorganic barrier layer 380, and the inorganic barrier layer 380 covers the exposed sidewall of the display medium 150 and an outer edge 170e of where the third barrier layer 170 is connected to the display medium 150.

In the embodiments, the material of the inorganic barrier layers 370 and 380 may include metal, an organo-silane material, an organo-titanium material, an organo-aluminum material, or combinations thereof. Among the organo-metal materials, the organic portion includes hydrophilic functional groups for adhering to the metal enclosing wall 160 and hydrophobic functional groups for providing water-oxygen resistant effects.

As shown in FIG. 5, the display device 300 may further includes an IC component 310 disposed on the second substrate 110. In the embodiment, the flexible cable 320 is bonded to the second substrate 110 through the solder pad 330.

Figure 6:
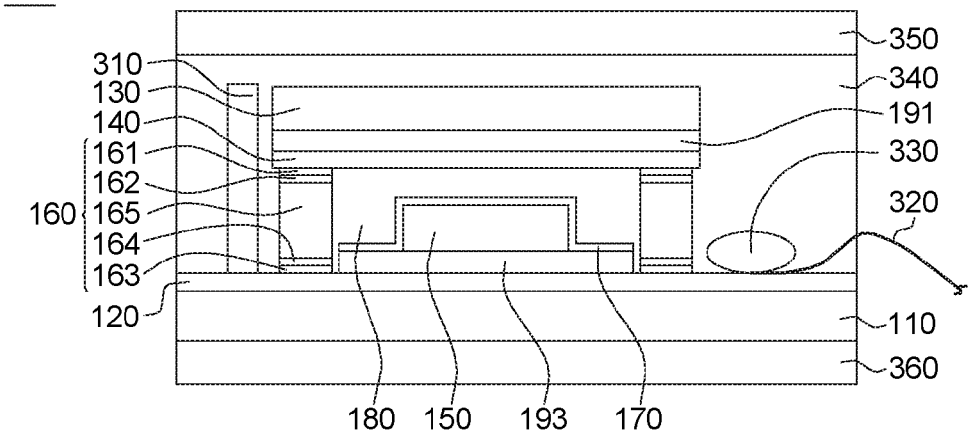
FIG. 6 shows a schematic view of a display device according to a further embodiment of the present disclosure.

FIG. 6 shows a schematic view of a display device 400 according to a further embodiment of the present disclosure. The elements in the present embodiment sharing the same labels with those in the previous embodiments are the same elements, and the description of which is omitted.

As shown in FIG. 6, the display device 400 may further include an encapsulating glue 340. The encapsulating glue 340 is formed on the second substrate 110. In the embodiment, the encapsulating glue 340 is water-oxygen resistant. In the embodiment, as shown in FIG. 6, the size of the first substrate 130 is smaller than the size of the second substrate 110, and the encapsulating glue 340 covers the second substrate 110, the first substrate 130, and the metal enclosing wall 160. In the embodiment, the top surface of the encapsulating glue 340 is such as planar, which is advantageous to the formation of additional films on the encapsulating glue 340 in subsequent manufacturing processes.

As shown in FIG. 6, the display device 400 may further include a first functional film 350. In addition, as shown in FIG. 6, the display device 400 may further optionally include a second functional film 360. The encapsulating glue 340 is provided with a sufficient adhesive ability for the first functional film 350 to be adhered directly on the encapsulating glue 340 without requiring any additional adhesive layers. In the embodiment, the thickness of the first functional film 350 is about 200-300 μm. The second functional film 360 is disposed below the second substrate 110; in the embodiment, the thickness of the second functional film 360 is thinner than the thickness of the first functional film 350. In the embodiment, the first functional film 350 and the second functional film 360 are such as transparent water-oxygen resistant films, and of which the materials are such as poly methyl methacrylate (PMMA), polyethylene terephthalate (PET), or polycarbonate (PC).

Figure 7:
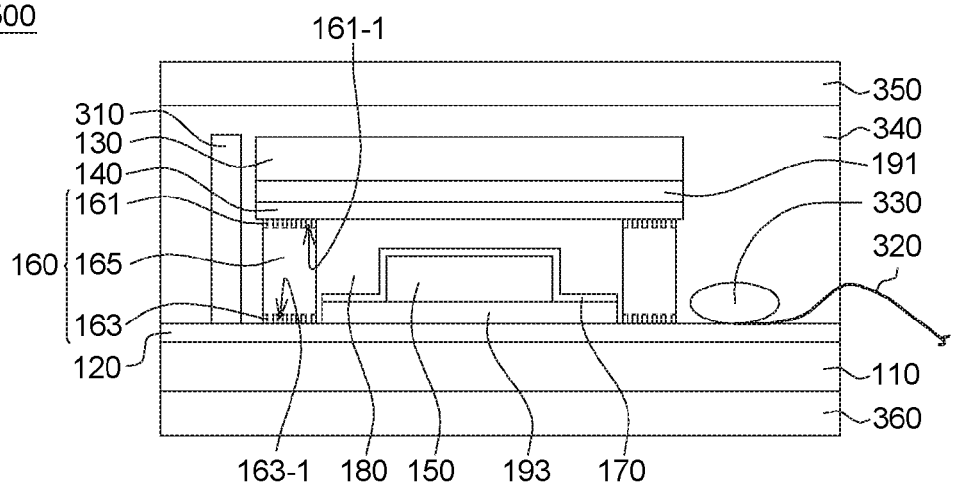
FIG. 7 shows a schematic view of a display device according to a still further embodiment of the present disclosure.

FIG. 7 shows a schematic view of a display device 500 according to a still further embodiment of the present disclosure. The elements in the present embodiment sharing the same labels with those in the previous embodiments are the same elements, and the description of which is omitted.

The display device 500 as shown in FIG. 7 is different from the display device 400 as shown in FIG. 6 mainly in the design of the metal enclosing wall 160. The metal enclosing wall 160 as shown in FIG. 7 adopts the design as shown in FIG. 1B. In addition, in the display device 500, the flexible cable 320 is bonded to the second substrate 110 through the solder pad 330.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
a first substrate and a second substrate;
a first barrier layer disposed on the second substrate;
a second barrier layer disposed on the first substrate;
a display medium disposed between the first barrier layer and the second barrier layer; and
a metal enclosing wall connecting the first substrate to the second substrate and surrounding the display medium, wherein the metal enclosing wall comprises:
a first metal layer connected to the first substrate;
a second metal layer connected to the second substrate;
a third metal layer disposed between the first metal layer and the second metal layer;
a first cocrystallization layer formed between the first metal layer and the third metal layer; and
a second cocrystallization layer formed between the second metal layer and the third metal layer.

2. The display device of claim 1, wherein each of the first cocrystallization layer and the second cocrystallization layer has a cocrystallization temperature of 140-230° C.

3. The display device of claim 1, wherein each of the first cocrystallization layer and the second cocrystallization layer has a thickness of 2-5 Å.

4. The display device of claim 1, further comprising:
a thin film transistor layer disposed between the second substrate and the display medium; and
a fan-out structure disposed between the second substrate and the second metal layer.

5. The display device of claim 1, wherein a material of the third metal layer comprises a metal satisfying the following condition: $1 < R_{PB} < 2$, wherein $R_{PB} = (M_{oxide} * \rho_{metal})/(n * M_{metal} * \rho_{oxide})$, $M_{metal}$ is the atomic mass of the metal, $M_{oxide}$ is the molecular mass of a metal oxide of the metal, $\rho_{metal}$ is the density of the metal, $\rho_{oxide}$ is the density of the metal oxide of the metal, and n is the number of atoms per one molecular of the metal oxide of the metal.

6. The display device of claim 1, wherein a material of the first metal layer and a material of the second metal layer respectively comprise copper (Cu).

7. The display device of claim 1, further comprising:
an inorganic barrier layer covering a sidewall of the metal enclosing wall.

8. The display device of claim 7, wherein a material of the inorganic barrier layer comprises metal, an organo-silane material, an organo-titanium material, an organo-aluminum material, or combinations thereof.

9. The display device of claim 1, further comprising:
a filling material filled inside the metal enclosing wall and covering the display medium, wherein the filling material has hydrophilic functional groups adjacent to the first barrier layer and the second barrier layer, and the filling material has hydrophobic functional groups adjacent to the display medium.

* * * * *